United States Patent [19]

Nelson

[11] Patent Number: 5,072,520

[45] Date of Patent: Dec. 17, 1991

[54] METHOD OF MANUFACTURING AN INTERCONNECT DEVICE HAVING COPLANAR CONTACT BUMPS

[75] Inventor: Gregory H. Nelson, Gilbert, Ariz.

[73] Assignee: Rogers Corporation, Rogers, Conn.

[21] Appl. No.: 601,904

[22] Filed: Oct. 23, 1990

[51] Int. Cl.⁵ .................................. H01K 3/10
[52] U.S. Cl. ........................... 29/852; 29/874; 29/877; 29/884; 156/630; 156/634; 156/656
[58] Field of Search ............... 29/846, 852, 884, 874, 29/877; 156/630, 634, 656, 901; 439/67

[56] References Cited

U.S. PATENT DOCUMENTS

| | | | |
|---|---|---|---|
| 4,159,222 | 6/1979 | Lebow et al. | 156/632 |
| 4,236,777 | 12/1980 | Merlina et al. | 29/848 |
| 4,306,925 | 12/1981 | Lebow et al. | 29/848 |
| 4,566,186 | 1/1986 | Bauer et al. | 29/852 |
| 4,722,765 | 2/1988 | Anbros et al. | 156/630 |

Primary Examiner—P. W. Echols
Attorney, Agent, or Firm—Fishman, Dionne & Cantor

[57] ABSTRACT

An interconnect or circuit device having coplanar contact bumps, and the method of manufacture thereof are presented. The coplanar contact bumps are formed against a flat reference surface whereby the resulting bumps have coplanar means.

8 Claims, 16 Drawing Sheets

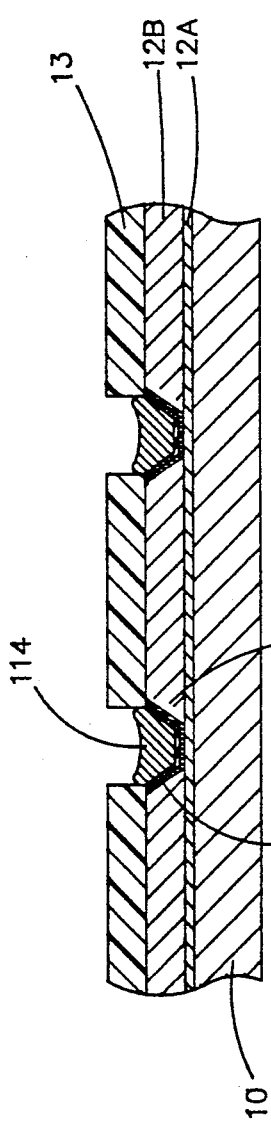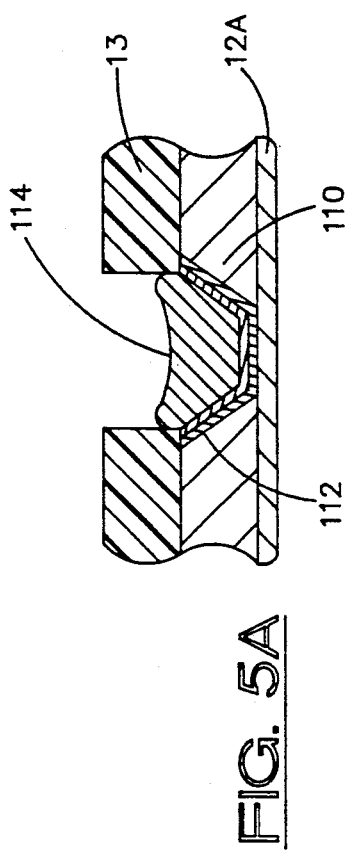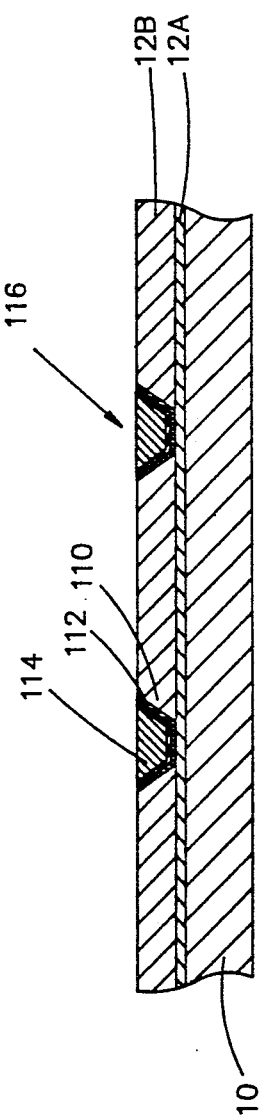

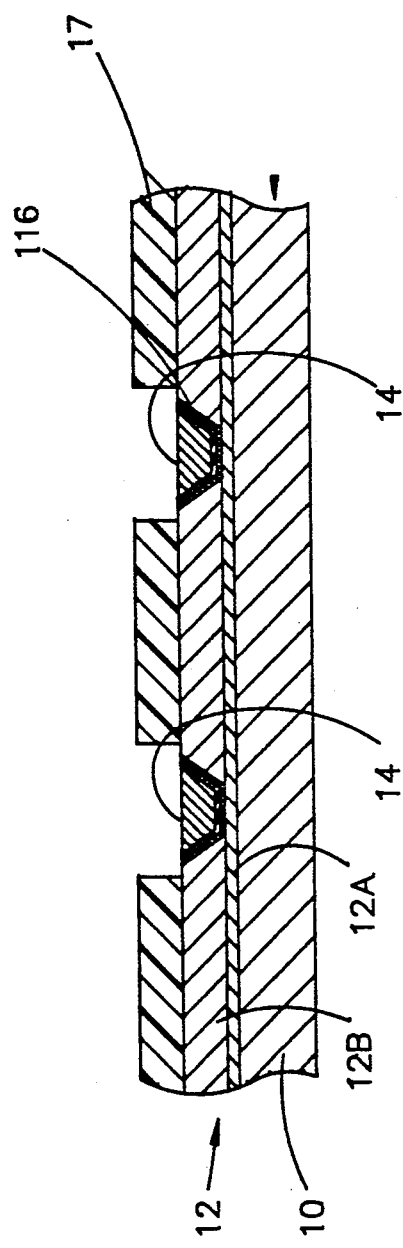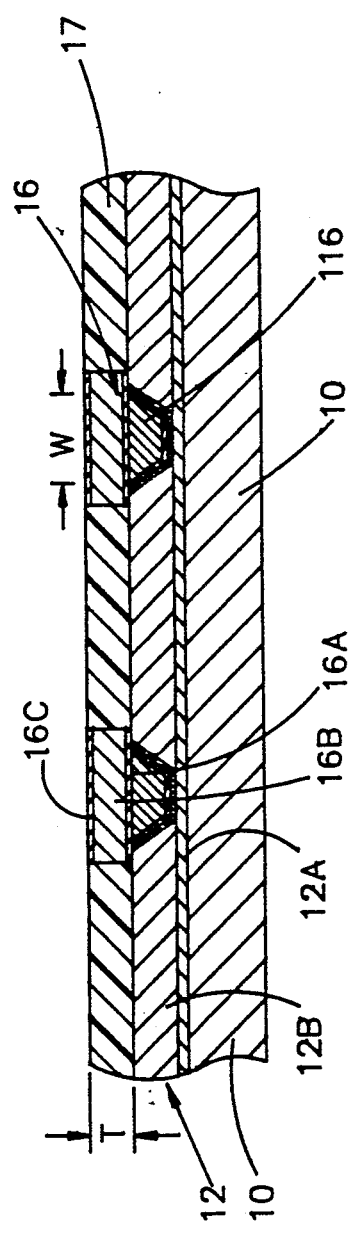

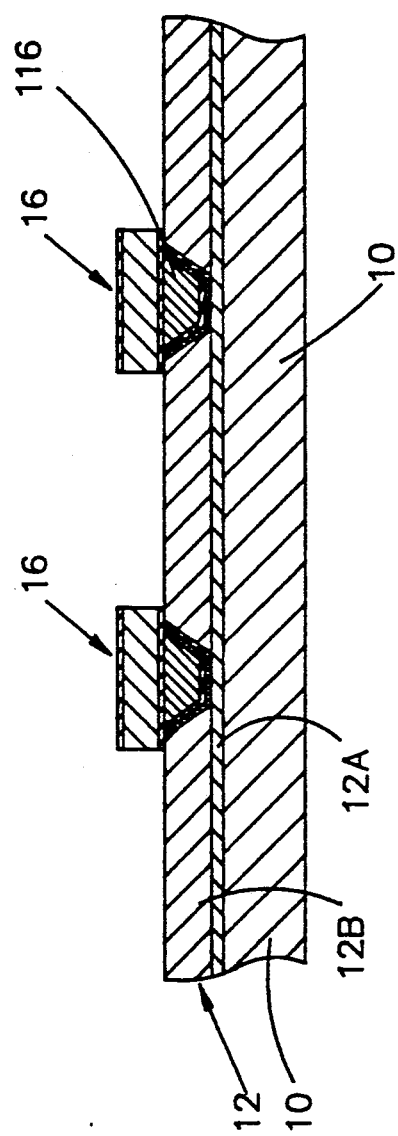

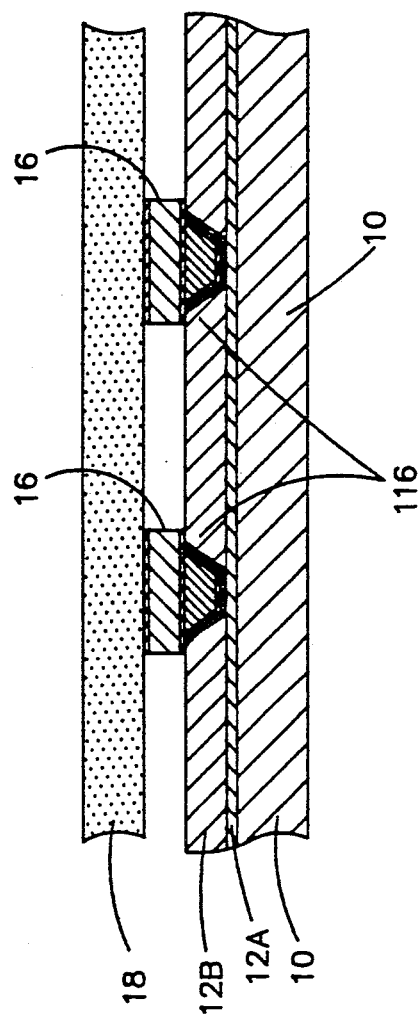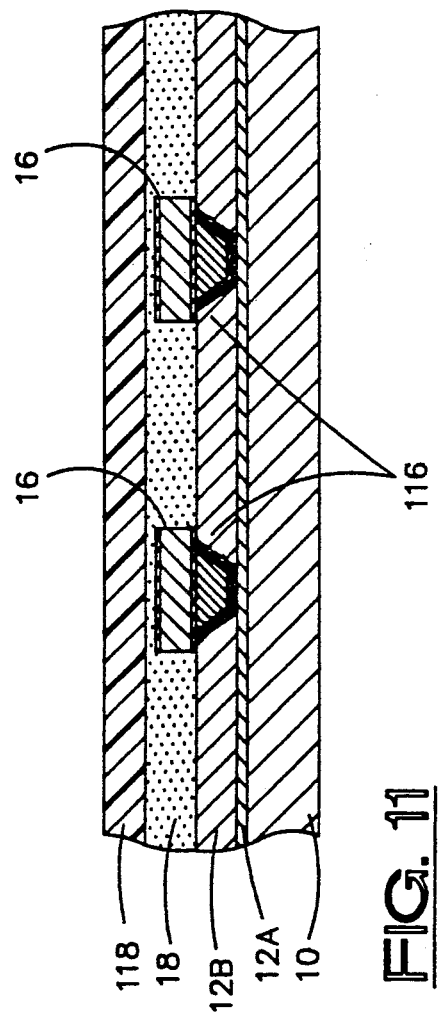

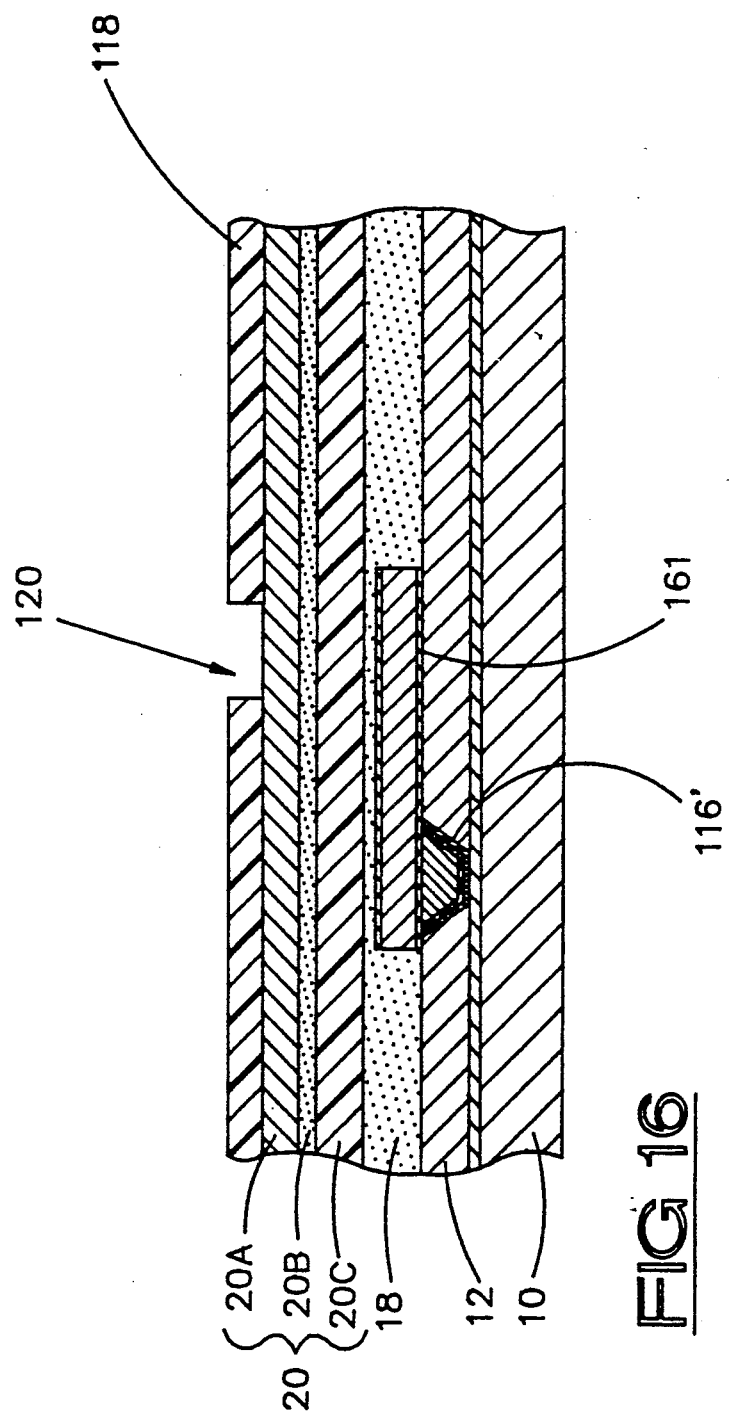

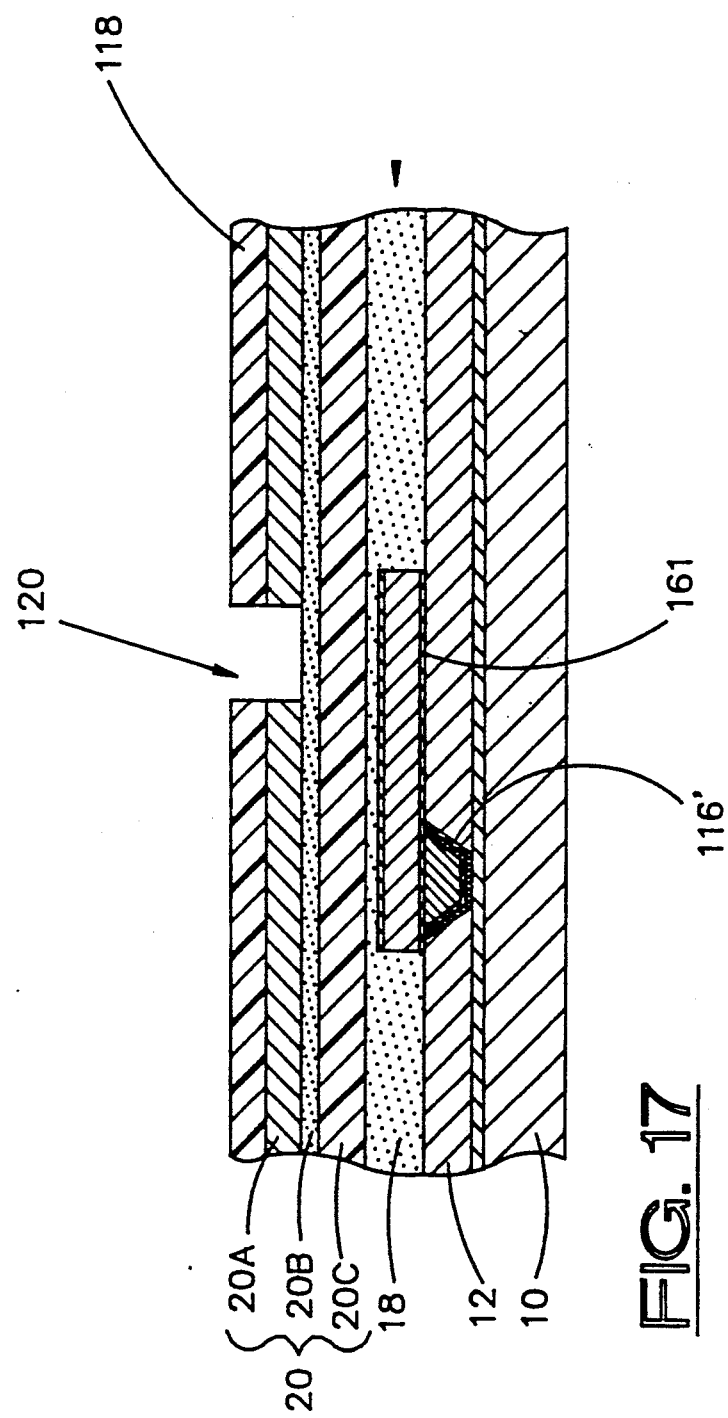

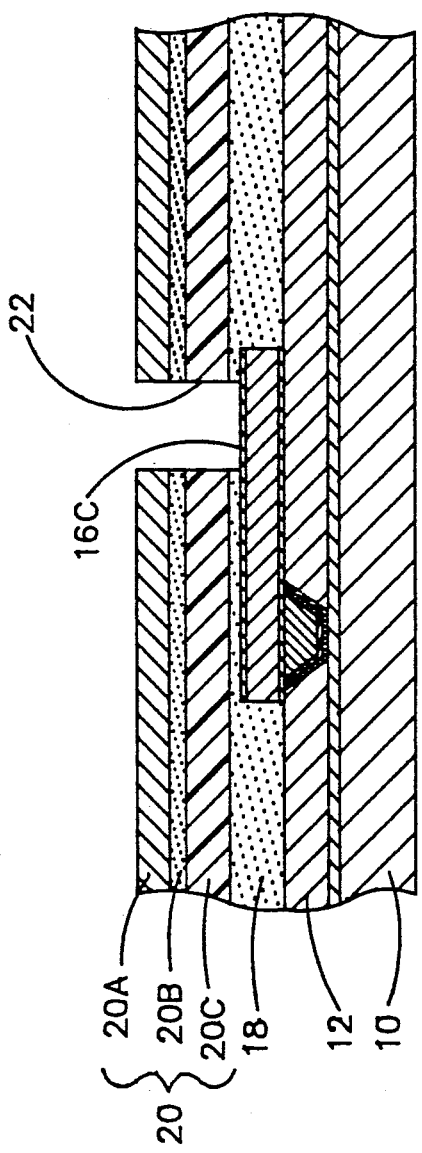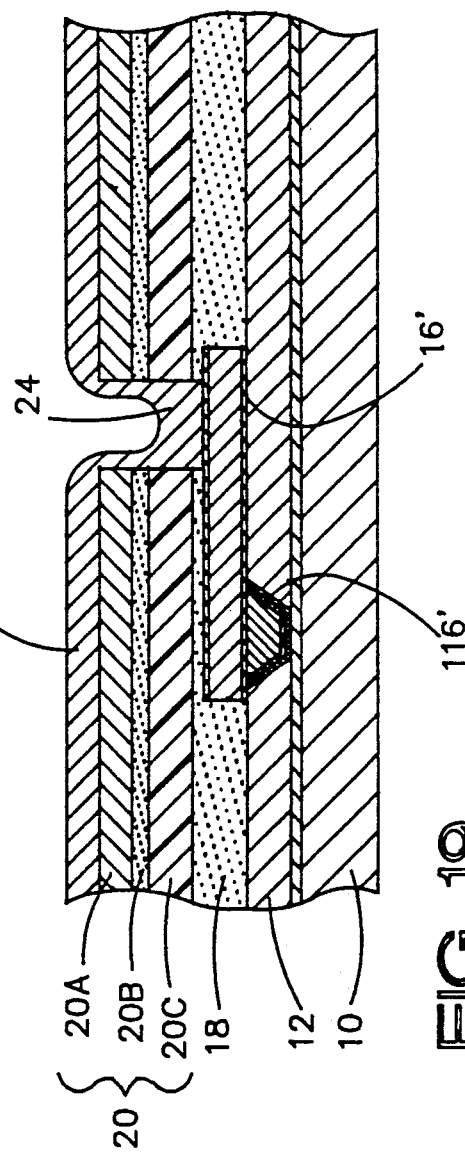

METHOD OF MANUFACTURING AN INTERCONNECT DEVICE HAVING COPLANAR CONTACT BUMPS

BACKGROUND OF THE INVENTION

It is well known in the art to use raised contact elements (sometimes referred to as "bumps") to make contact for electrical interconnection. Such bump contacts are frequently used on interconnect devices or circuitry that is used to connect a circuit to an electronic component or to another circuit. By way of example, it is known to use bump contacts to connect one circuit component to another, often by the use of a pressure connection system such as shown, e.g., in U.S. Pat. Nos. 4,468,074, 4,610,495, and 4,768,971. For example, it is known to use contact bumps on flexible circuitry to connect to circuit boards via a pressure connection. Uniformity of bump height is not crucial in many such applications because the flexibility of the circuitry and the distance between bump sites allows the device a degree of conformity to make the contacts. However, that is not true when the density of bump contact increases and the bumps come closer together. In such cases the flexibility of the interconnect circuit material may not provide the needed compensation to overcome differences in bump height, and malfunctions will occur because of failure to make contact where required.

When bump contacts are used in a high density contact applications, such as multichip module (MCM) to circuit board connections (e.g., pitch (center to center of adjacent contact sites) under 50 mils), it is extremely important that coplanarity of the bump contact surfaces be maintained. That is, the height of the bumps must be carefully controlled so that the top or contact surfaces of all of the bumps will be in the same plane in order to make contact with the contact points on the MCM or other device to be contacted. If the bump height differs from bump to bump, contact may not be established at all contact sites. For example, if a shorter bump is located between two higher bumps, the shorter bump may not make contact with its intended contact site on the MCM or other device, thereby resulting in a malfunction.

The need for bump coplanarity, especially in high density interconnect applications, is recognized in the art, but it has heretofore been difficult to achieve that objective. The present invention presents an effective and reliable way to achieve coplanar bump contacts.

SUMMARY OF THE INVENTION

The present invention addresses the problems discussed above in a new and improved coplanar bump interconnect device and method of manufacture thereof. While the present invention is particularly suitable for high lead count interconnect devices (such as for MCM's), and will be described in that context, it should also be understood that the features and advantages of both the process and the end product of the present invention can also be employed in similar interconnect devices that do not have high lead count requirements and also in other interconnect devices in general.

In accordance with the present invention, contact bumps are formed by an additive process where the bumps are formed against a flat reference surface. The bumps are first formed as isolated bodies embedded in a dimensionally stable temporary mold layer of material on the reference surface, i.e., the bumps are formed apart from circuit lines or traces. Thereafter, the bumps are incorporated into circuit lines or traces, which are preferably formed by the additive process described in my copending application Ser. No. 352,112, filed May 15,1989 and assigned to the assignee hereof. After formation of the circuitry, the flat reference surface and the temporary stability mold layer are removed to leave a circuit interconnect device with bumps of equal height with coplanar flat mesa contact surfaces.

In addition to the bumps of the present invention being of uniform height and having coplanar flat mesa contact surfaces, the hardness of the bumps can be selected and controlled by selection of the material used in the additive manufacturing process.

The above discussed and other features and advantages of the present invention will be apparent to and understood by those skilled in the art from the following detailed description and drawings:

BRIEF DESCRIPTION OF THE DRAWINGS

Referring to the drawings, wherein like elements are numbered alike in the several FIG.S:

FIGS. 2-11 are partial sectional elevation views as if taken along line A—A of FIG. 1, but showing the status of the invention at different stages of manufacture.

FIGS. 15-24 are partial sectional elevation views taken along line B—B of FIG. 14, but showing the status of the multilayer device at different stages of manufacture.

DESCRIPTION OF THE PREFERRED EMBODIMENT

The coplanar bump interconnect device and method of the present invention are suitable for use with the entire range of high density electrical interconnect devices where it is desired to connect a circuit to an electronic device and/or to other circuitry. While the present invention is particularly suitable for use in high density interconnect applications, the invention can also be used with any interconnect device or circuit where bump contact elements are intended to make electrical contact with an electronic element or circuit.

Figure 25:
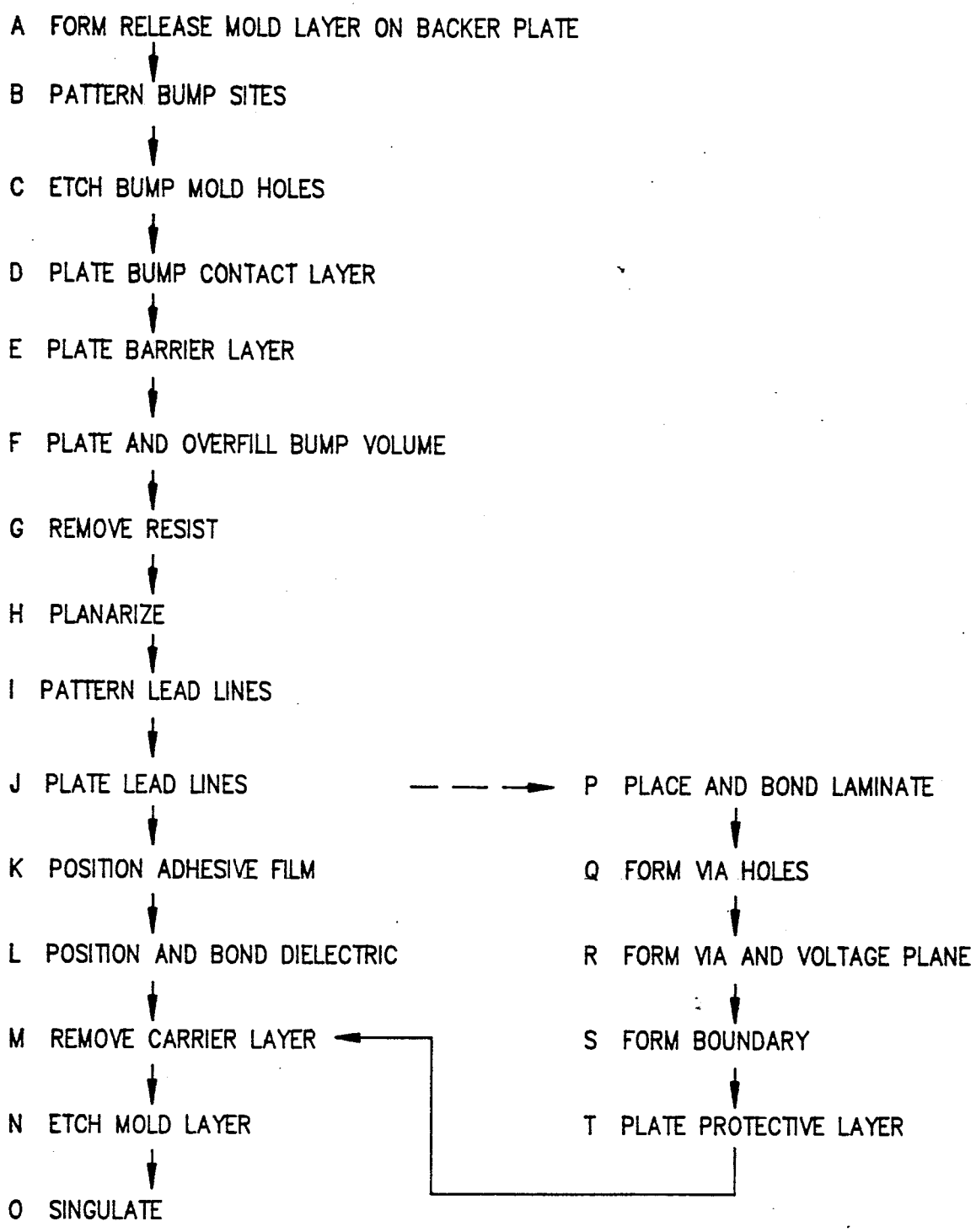
FIG. 25 is a block diagram of the manufacturing process of the present invention.

The device of the present invention and its method of manufacture are illustrated in the drawings. To facilitate an understanding of the invention, both the device and its method of manufacture will first be described in a combined consideration of FIGS. 1-13 and the process diagram of FIG. 25.

Figure 2:
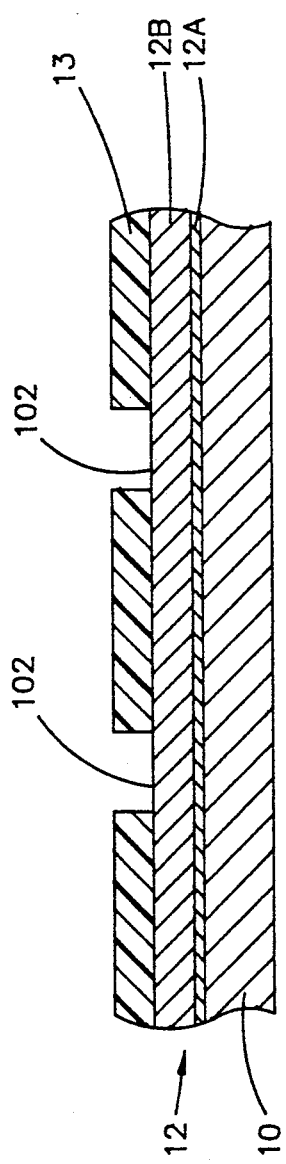
Figure 3:
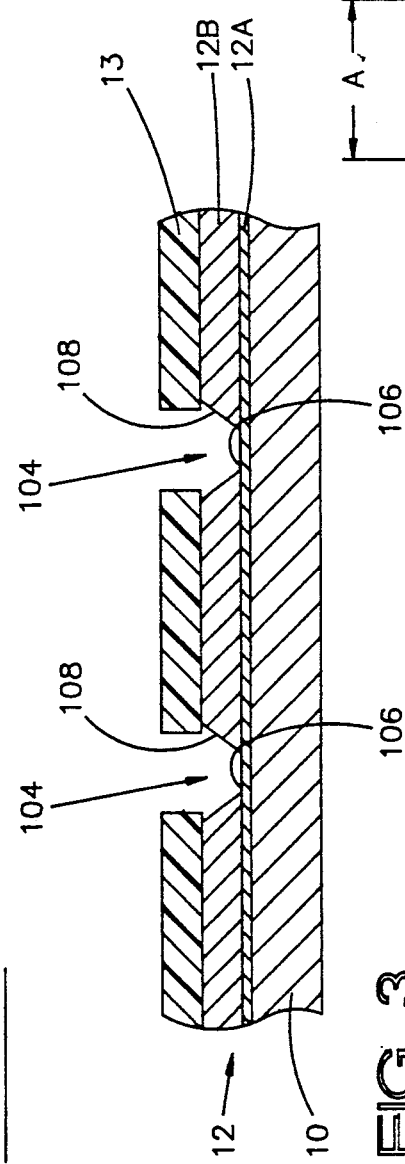

Referring first to FIGS. 2 and 3, a stainless steel carrier or base plate 10 forms the support structure on which a plurality of coplanar bump circuits or interconnect devices are formed in the manufacturing process.

Figure 1:
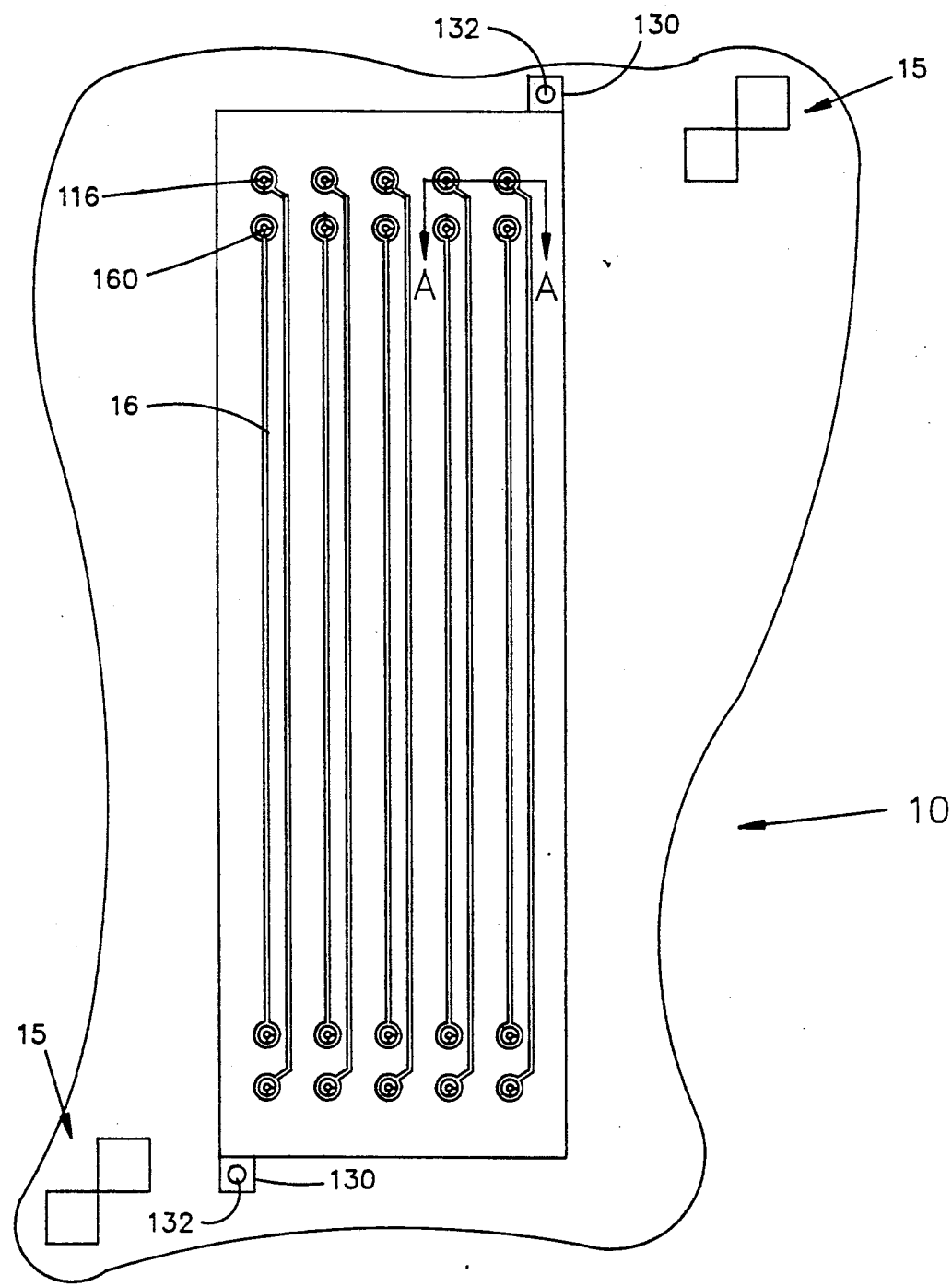
FIG. 1 is a plan view of a flexible circuit interconnect device in accordance with the present invention (viewed from the bottom in the manufacturing process).

Base plate 10 can be of other materials, the requirement being that it be flat, dimensionally stable, and have a highly polished conductive surface While a plurality of coplanar bump circuits or interconnect devices are formed on carrier plate 10, only one such device is shown and described herein (as indicated by the irregular line surrounding the device in FIG. 1). It will, however, be understood that a plurality of such circuits or interconnect devices are all formed at the same time on the surface of plate 10. Also, while only two bump sites are shown in FIGS. 2-11, it will be understood that as many bump sites as desired (e.g., several hundred or even several thousand for a high lead count interconnect device) may be formed simultaneously by the process to be described.

A release/mold layer 12 is formed by electroplating on base layer 10. Release/mold layer 12 consists of a thin layer 12(A) of nickel electroplated to plate 10 and a thicker layer 12(B) of copper electroplated on top of the nickel layer. Since neither the nickel nor the copper are strongly adherent to the stainless steel plate (thus constituting a release layer relative to the stainless steel plate), the layers of nickel and copper are formed to extend over the entire surface of plate 10 (only a portion of which is shown in the drawings) and to wrap around the sides of plate 10 and to extend a short distance along the back (i.e., bottom) surface. This serves to lock the layers 12(A) and 12(B) to the stainless steel plate to give dimensional stability to the stainless steel plate-release/mold layer structure for the manufacturing process, while permitting easy release of stainless steel plate 10 from release/mold layer 12 when it is desired to do so near the end of the manufacturing process. Nickel release layer 12(A) is preferably about one half mil (0.0005") thick. The thickness of copper mold layer 12(B) will be equal to the desired thickness of the coplanar bumps to be formed. Typical thickness for copper mold layer 12(B) will range from one mil (0.001") to ten mils (0.01"). The step of forming layers 12(A) and 12(B) on stainless steel plate 10 is indicated at step A in FIG. 25. The nickel/copper release layer concept is disclosed in U.S. Pat. Nos. 4,159,222 and 4,306,925. prior to plating the nickel on the stainless steel plate, the plate is highly polished and inspected for flatness, and the surface is chemically cleaned and activated with an alkaline electrocleaning treatment to remove any oxide buildup. This processing of the plate 10, coupled with the wrap feature, produces the desired release layer which will be adherent during the process and releasable at the end of the process.

For the next step in the manufacturing process, a standard photoresist process is employed to define sites on the upper surface of copper layer 12(B) where contact bumps are to be formed. That is, a resist material 13 is deposited on the upper surface of copper layer 12(B), and the resist layer is then photoexposed through suitable artwork to define a pattern of bump sites 102 where unexposed resist is washed away, and the rest of the upper surface of copper layer 12(B) remains covered with photoresist. As a final step in this photoresist patterning, a plasma etch cleaning step may be performed to clean out the areas where the photoresist has been washed away to obtain sharp, clean, fine bump site definition. The photoresist, with portions removed to define the bump sites 102 is shown in FIG. 2. This photoresist bump site patterning step is indicated at step B in FIG. 25.

Figure 4:
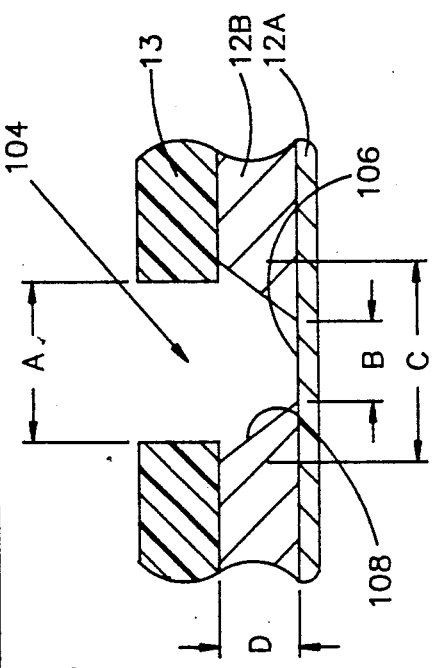

The copper at site 102 is then etched away to form a plurality of holes 104 in copper layer 12(B) (see FIG. 3). An alkaline etchant, such as MacDermid Ultra Etch FL, which etches copper but does not etch nickel is used. The copper in layer 12(B) at the bump sites is etched away until a flat portion 106 is exposed at the surface of nickel layer 12(A). The holes 104 with the flat portions 106 at the bottom form molds in which the coplanar contact bumps of this invention are formed. These holes 104 are formed with conical side walls 108 extending down to and defining the exposed flat portions 106 of nickel layer 12(A). An enlarged view of a hole 104 is shown in FIG. 4. The shape of the hole 104 and the exposed flat portion 106 of the nickel layer (and the resulting contact bump to be formed) may be circular or of other shape, e.g., oval, etc. The shape will be determined by the patterning of the resist 13. Typical dimensions for a circular hole (and for the corresponding parts of the contact bump to be formed therein) for an interconnect product could, depending on circuit or trace line width and spacing, be as follows: A=0.002"-0.010"; B=0.001"-0.008"; C=0.0025"-0.020"; D=0.001"-0.010". It will, of course, be understood that those dimensions are only exemplary, and they may be varied as desired and in accordance with the desired height of the bump to be formed (which equals the hole dimension D) and the desired size of the flat top surface of the bump to be formed (which equals the dimension B). The etching of bump mole holes 104 is indicated at step C in FIG. 25.

Next, formation of the contact bumps is begun by electroplating a thin contact layer of metal 110, preferably gold, on the walls 108 of holes 104 and on the exposed surfaces 106 of nickel layer 12(A); and a thin barrier layer 112, preferably nickel, is then electroplated over gold contact layer 110. The remainder of each hole 104 is then filled with copper 114 by electroplating. The gold layer 110 is preferably about 125 to 175 microinches thick, and the nickel layer 112 is preferable about 25 to 75 microinches thick. The layers 110 and 112 are not limited to gold and nickel nor are they limited to the stated thickness ranges. Rather, they may be any suitable metals dissimilar from each other and other than copper; and the thicknesses may change as desired. This is an important feature to note, because the hardness of the bumps can be selected for particular application by selection and relative thicknesses of all of the materials used in the formation of the bumps. For example, if gold is used for a majority of the volume of the bump, the bump will be relatively soft; if the majority of the material is nickel, the bump will be harder; if the majority is copper, the hardness will be between that of gold or nickel. The steps of plating layers 110 and 112 and filling the remainder of the holes with copper are shown at steps D, E and F in FIG. 25 and in FIGS. 5 and 5A.

To insure proper formation of the bumps and coplanarity in the end product, it is important that copper 114 be plated to overfill the remainder of each hole 114, i.e., protrude above the top of copper mold layer 12(B) as shown in FIG. 5 and in the enlarged view of FIG. 5A to ensure that the central dip or depression formed in the plating process is not below the upper surface of layer 12B.

The photoresist 13 is then removed, and the excess copper protruding above the surface of layer 12(B) is removed, e.g., by mechanical abrasion, to planarize the bump structure relative to the exposed surface of mold layer 12B. The removal of the photoresist and planarization are shown at steps G and H of FIG. 25 and in FIG. 6.

The structure that will form the bumps 116 has now been formed in each of the holes 104, and the process now moves on to formation of circuit lines (see FIGS. 7-11). To that end, a layer of photoresist 17 is deposited on the upper surface of copper layer 12(B) (including over the bump elements now formed therein), and the photoresist is then exposed through suitable artwork to define a pattern of circuit lines or trace areas 14 on copper layer 12(B) where unexposed resist is washed away, and the rest of the upper surface of copper layer 12(B) remains covered with photoresist. The lines 14 extend over the bump elements now formed in layer 12(B), so that each bump will be included in a circuit line or pad to be formed. Typically, a line 14 will include a pad area around the bump of slightly enlarged size relative to the bottom of the bump. As a final step in this photoresist patterning, a plasma etch cleaning step may be performed to clean out the areas where the photoresist 17 has been washed away to obtain sharp clean fine leads over the bump sites. The photoresist, with portions removed to define the lead or trace lines over the bump sites is shown in FIG. 7 and is included in step I in FIG. 25. Note that not all bumps need necessarily be included in circuits. Some bumps could also be used for mechanical offset or spacing purposes.

Leads 16 are then formed by electroplating on the surfaces 14. A three step electrodeposition process (see FIG. 8) is used whereby each lead 16 is formed first by electroplating a thin layer 16A of gold on surface 14 (including over the bumps 116), then electroplating a main layer of copper 16B and then electroplating another thin layer 16C of gold. Other electroplatable metals such as tin or nickel, may be used instead of or in addition to the gold layers 16A, 16C. The gold of layer 16A bonds to bumps 116 so that the bumps become part of the leads that are formed. Also, if spacing permits, an enlarged "pad" area may be formed in the artwork and photoresist pattern and in the leads at the sites of the bumps (see pads 160 in FIGS. 1 and 12). If desired, the total thickness "T" of each lead 16 may be about 0.001"; and the width "W" of each lead (not including the pad area) and the spacing therebetween may be as fine as 1 to 2 mils (0.001"-0.002"-). It will be understood that FIG. 8 is a partial view and that only two of the leads 16 and bumps are shown in FIG. 8 for purposes of illustration. The step of pattern plating leads 16 is indicated in step J in FIG. 25. The remaining resist material on the surface of copper layer 12(B) is then removed to leave exposed leads 16 on the upper surface of copper layer 12(B). The resist removal step is included in step J in FIG. 25. FIG. 8 shows the the electroplated leads 16 with the resist 17 still in place, and FIG. 9 shows the manufacturing stage where the resist has been removed. The leads 16 and pads are bonded to the bumps 116. Leads 16 are typically signal leads which carry signals to or from electrical components, such as chips on an MCM, and the layer in which leads 16 are located is sometimes referred to as a signal plane.

As an integral part of the photoresist patterning of step B and the plating of steps D, E or F, a plurality of registration features 15 (see FIG. 1) are also located and formed on release layer 12 to serve as markers for accurate location of lines 16 relative to bumps 116 (and also for accurate location of via holes in a later stage of the manufacturing process if a multilayer device is to be made), if desired. A number of such registration features 15 are formed on release layer 12 over the expanse of plate 10, to serve as registration markers for all of the interconnect devices formed at the same time in the manufacturing process, but only two are shown in FIG. 1.

After resist 17 is removed, a free film adhesive 18 is then placed on top of the leads 16. The adhesive film is activated by heat and pressure; it may be, e.g., a phenolic butaryl epoxy known as 8970 available from Rogers Corporation, the assignee hereof. Initially this free film is supported on top of the leads 16 and does not surround the leads 16. This step of positioning the adhesive film is shown in FIG. 10 and is indicated at step K in FIG. 25.

At this point the remaining steps in the process will depend on whether a single layer interconnect or other circuit device is to be produced or a multilayer device is to be produced. If a single layer device is to be produced, a thin sheet of dielectric 118, such as a polyimide, polyamide, polyethylene, etc. is placed on adhesive film 18, and heat and pressure are applied to cause adhesive layer 18 to flow around leads 16 to bond the dielectric 118 to leads 16 and to copper layer 12(B) as shown in FIG. 11 and in step L of FIG. 25. Instead of separate layers of free film adhesive 18 and dielectric 118, a preformed cover film of adhesive and dielectric could be used.

After step L, the carrier plate 10 is removed by (a) breaking the wrap of release/mold layer 12 and (b) separating the carrier 10 from release/mold layer 12. This can be done manually since, as previously discussed, release/mold layer 12 is not strongly adherent to plate 10. After removal of plate 10, release/mold layer 12 remains bonded to leads 16 and adhesive film 18, so it remains necessary to remove release/mold layer 12. This is done by (a) etching away all of nickel layer 12A and then (b) etching away all of copper layer 12B, or by the use of a single etchant, such as ferric chloride, that will etch nickel and copper but not gold. That leaves exposed the gold plated surface 110 of bumps 116 and the gold plated surface 16A of the circuit leads and pad areas. The steps of removal of carrier 10 and the etching to expose the bumps and circuit leads are shown at steps M and N in FIG. 25. A point to note at this juncture is that for the single layer product (i.e., single conducting layer), the leads 16 need not be gold-/copper/gold as described. Rather, the leads 16 could be any metal that (a) can be electroplated and (b) will not be etched by an etchant specific to copper (used for removal of copper layer 12(B)).

Upon removal of carrier 10 and release/mold layer 12, the resulting structure consists of a multiplicity of the individual interconnect devices joined together in a single sheet-like structure by the dielectric 118 and the adhesive 18 between the individual parts. The individual parts are then singulated, i.e., excised from the sheet-like structure, by any convenient means such as die cutting, laser cutting, etc. The singulation step is indicated at 0 in FIG. 25.

Figure 12:
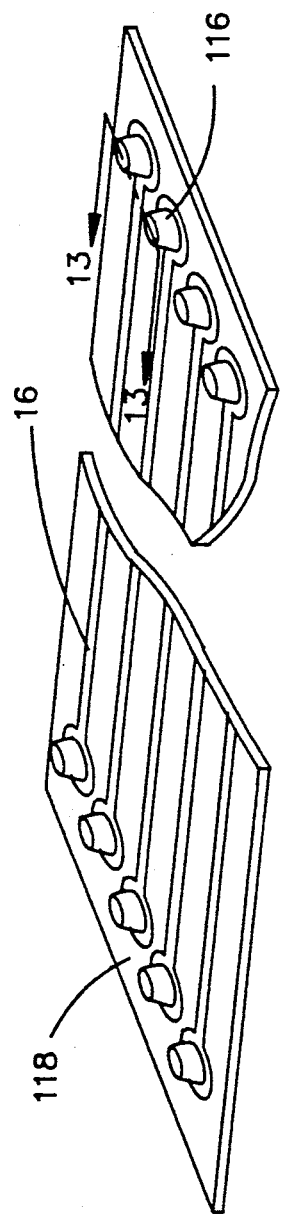
FIG. 12 shows a perspective view of the single layer interconnect device with coplanar bumps of FIG. 1.
Figure 13:
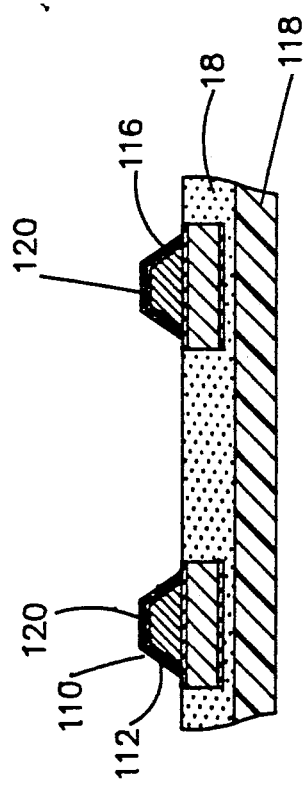
FIG. 13 is an enlarged detail along line 13—13 of FIG. 11.

The resulting product is a flexible circuit or interconnect such as shown in FIGS. 1, 12 and 13 having leads 16 and coplanar bumps 116. It will, of course, be understood that the circuit or interconnect device shown in FIGS. 1, 12 and 13 is for purposes of illustration only. The actual number and arrangement of leads 16 will depend on the intended use for the circuit. The important point to note, as shown in FIG. 13, is that each of the bumps 116 has a discrete flat top or mesa 120; and, most importantly, the mesas 120 are precisely coplanar within the limits of the flatness of the surface of carrier 10 and the surface of nickel layer 12(A) against which the bumps are formed. That is, since the mesas 120 are formed against nickel layer 12(A) which is only a very thin layer on carrier 10, it is possible with this invention to form precisely coplanar contact bumps by controlling and assuring the flatness of the surface of carrier 10. Once that is done, coplanarity of the bumps in the final product is assured.

Another important point to note is that the hardness of the bumps 116 can be controlled by controlling the respective volumes of the materials used to form bumps 116 and by selection of the materials as described above.

Figure 14:
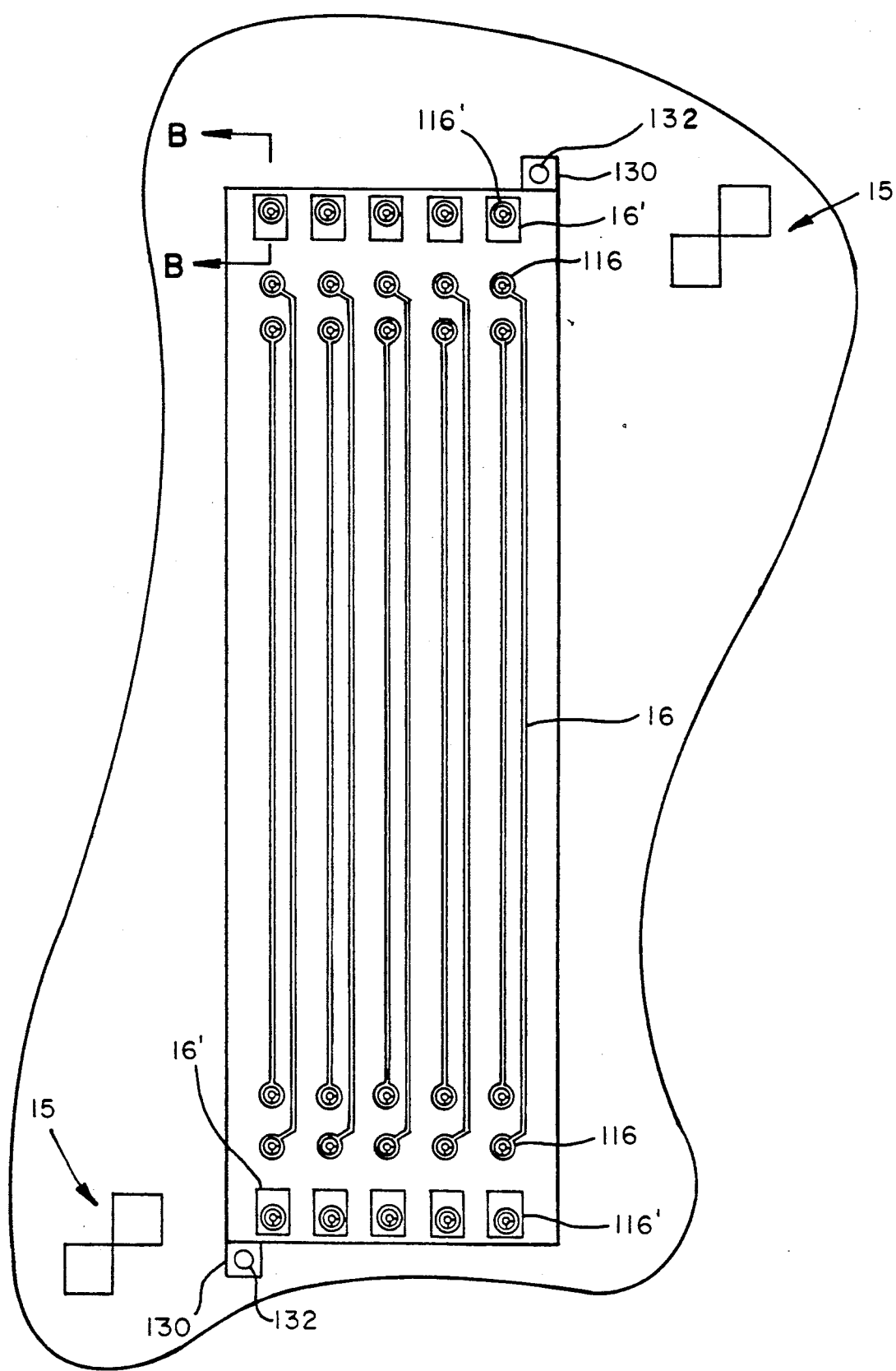
FIG. 14 is a view similar to FIG. 1 showing a second embodiment of the present invention with coplanar bumps in a multilayer (i.e., multiple conductive layers) flexible interconnect device.
Figure 15:
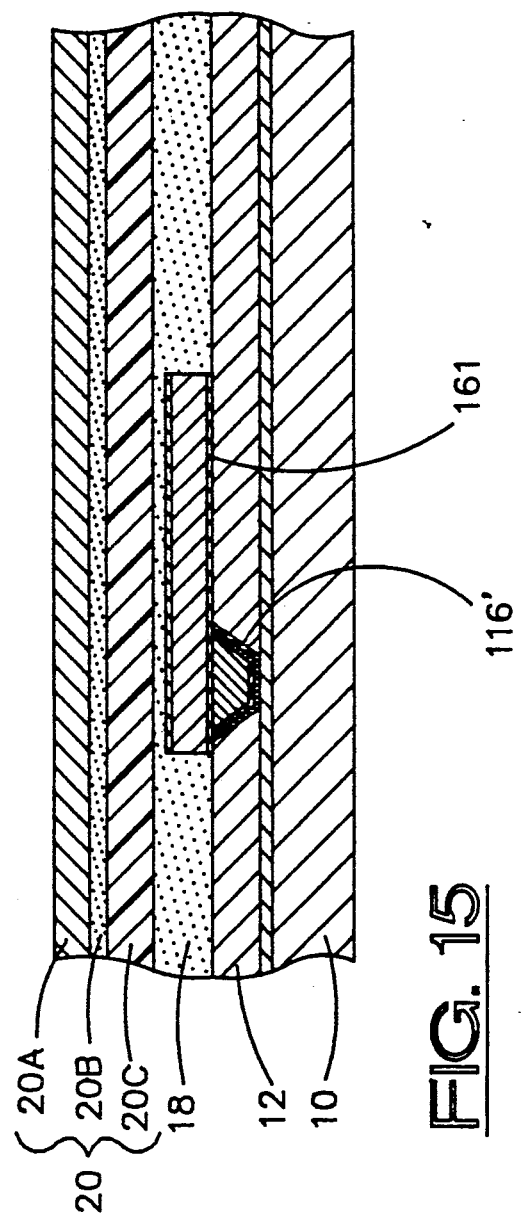

While a single metal layer device has been described above, the preferred configuration will be at least a two layer device where the second layer is a voltage (usually ground) layer. The finished two layer device is shown in FIG. 14 (which corresponds to FIG. 1), and the manufacture thereof is illustrated in FIGS. 15 to 24. The two layer device has bumps 116 and signal plane circuit lines 16 as described above; and it also has some bumps 116' at opposite ends of the device connected to a ground plane by vias (described hereinafter). Referring to FIG. 15, the bumps 116' are formed during the previously described process with enlarged pad areas 16' (which are formed at the same time and by the same process as circuit lines 16). Enlarged pads 16' can be viewed as stubs of circuit lines 16.

To form a multilayer interconnect product, the manufacturing process after step J, instead of proceeding to step K, proceeds to step P where a single clad laminate 20 of copper bonded to an insulating substrate which includes adhesive film 18 is bonded by heat and pressure to the pads 16' and to leads 16 and to release layer 12 as shown in FIG. 15. Laminate 20 may, e.g., be a layer of ½ oz. copper 20A bonded by a layer of adhesive 20B (e.g., 8970 identified above) to a layer of polyimide 20C (with adhesive 18 on the other side). Other laser etchable dielectrics such as fluoropolymer composites, fluoroimides, polyamide-imides, etc. and adhesives may be used instead of the described insulation system. It is important to position the laminate 20 so that the copper layer 20A faces away from bumps 116' and pads 16'. The application of heat and pressure causes the adhesive layer 18 to flow around and between the pads 16' as shown in FIG. 15, and also around the leads 16 as in FIG. 11, to bond the laminate to the leads 16, to the pads 16' and to mold layer 12B. The step of placing the laminate 20 and bonding it are indicated at step P in FIG. 20. Laminate 20 (including adhesive 18) is prepunched with holes to align with the registration features 15 to leave the registration features visible from the top of the assembly for accurate location of the vias in a subsequent step in the manufacturing process.

After laminate 20 has been bonded to the assembly, a series of via holes 22 (see FIG. 18) are formed in the assembly to permit electrical contact to be made with the pads 16'. The formation of only one via hole is shown in FIGS. 1614 19, but it will be understood that a via hole is formed at the site of each pad 16'. To form the vias, a layer of photoresist 118 is applied to copper layer 20A, and the photoresist is photographically exposed and developed to remove unexposed photoresist only at sites 120 where the vias are to be formed (see FIG. 16). The location of the areas where the photoresist is to be removed is accurately determined by reference to previously formed registration features 15.

After the photoresist has been removed at the via sites 120, the copper in layer 20A at the via locations is removed by etching to expose adhesive layer 20B (see FIG. 17). The remaining photoresist is then stripped to expose all of the remaining copper surface 20A. The adhesive layer 20B, the dielectric layer 20C and the adhesive layer 18 in the via path are then all removed by a suitable laser beam (such as a $CO_2$ or UV laser) acting as a drill. The exposed copper layer 20A constitutes a mask for the laser drill. The laser scans the surface 20A with no effect except in those locations where the copper in layer 20A has been etched away to expose adhesive layer 20B. At those locations, the laser beam drills (ablates) through the dielectric materials of layers 20B, 20C and 18 to expose the plated surface 16C of pad 16 and form the via holes 22. The via holes 22 are then cleaned by any standard technique (e.g., plasma cleaning, vapor honing, etc.) to define sharp and clean walls in the via holes and a clean exposed surface at layer 16C of pad 16'. The step of forming the via holes is indicated at step Q in FIG. 25 and the via holes are shown in FIG. 18.

Referring to FIG. 19, copper 24 is then plated to the exposed surface of pad 16', along the walls of via holes 22 and to the exposed surface of copper layer 20C to complete the via and form an electrical connection from pad 16' to copper layer 20A. Copper layers 24/20A serve as a voltage (power or ground) plane in the final product. Copper layer 24 is formed in a two step process where first a very thin layer of copper is formed by electroless deposition, and then the remainder of layer 24 is formed by electroplating. The total thickness of layer 24 is about ½ mil (0.0005"). The formation of layer 24 to form the vias and connect the pads 16' to the power or ground plane is indicated at step R in FIG. 25.

Figure 20:
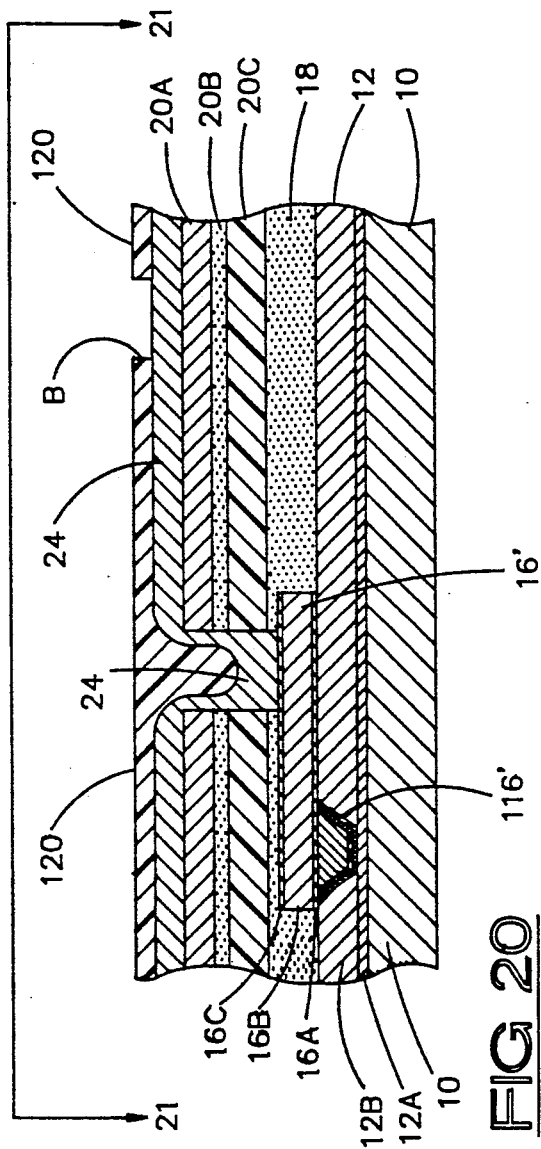
Figure 21:
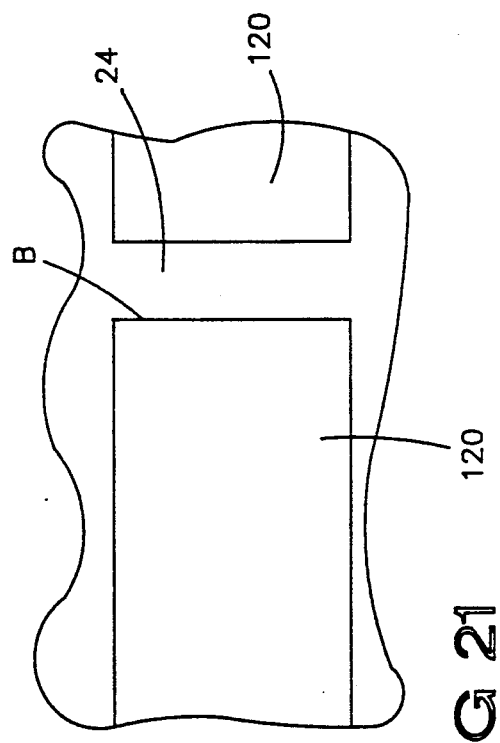
Figure 22:
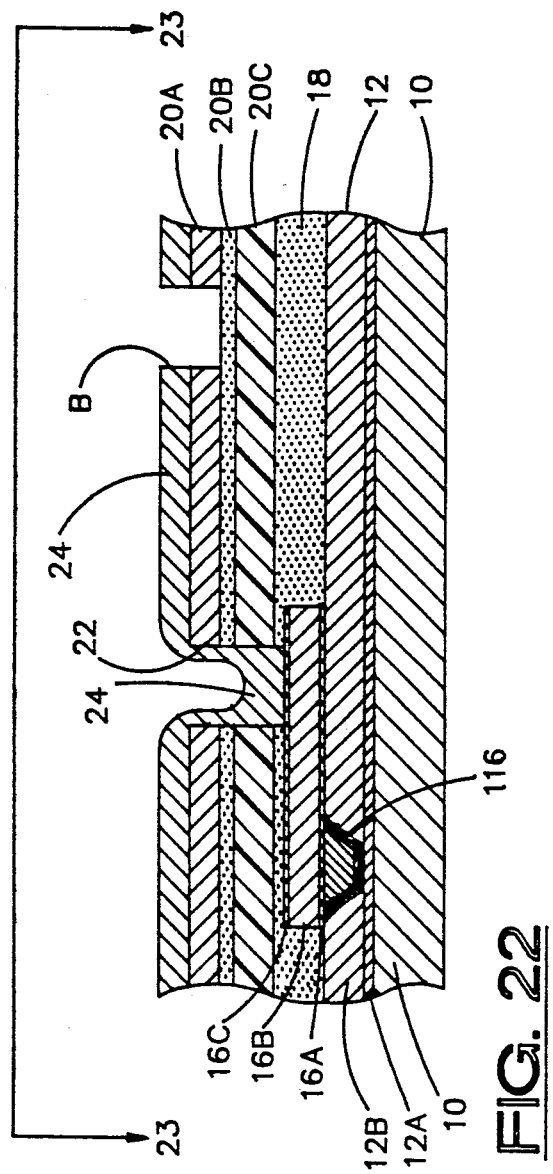

Referring to FIGS. 20 and 21, another layer of photoresist 120 is then applied to copper layer 24, and the photoresist is exposed and developed to define the outer dimensions and shape of the ground plane to be formed in the device. The photoresist is removed to expose copper layer 24 in those areas which are to be outside the boundary B of each interconnect device formed. The exposed copper in layer 24 and layer 20A is then etched to remove the copper outside the boundary B of each level. The exposed resist prior to etching of exposed copper layer 24 and copper layer 20A is shown in FIGS. 20 and 21. After the copper is etched, the photoresist is stripped (see FIGS. 22 and 23 which correspond, respectively, to FIGS. 20 and 21). The formation of boundary B, including the etching of layers 24/20A, is shown at step S of FIG. 25. Optionally, a protective layer 122 of gold, gold on nickel, tin, or other material may then be plated to copper layer 24 (see FIG. 24). Layer 122 protects the ground plane against oxidation and against chemical attack during subsequent etching to remove the device from the release/mold layer. The optional plating of protective layer 122 is shown in step T of FIG. 25. Alternatively, photoresist 120 can be left in place to provide such protection, and it can then be removed after the device is removed from the release/mold layer.

After step T, the carrier plate 10 is removed by resort to steps M and N previously described. That is, the carrier plate is removed by (a) breaking the wrap of release/mold layer 12 and (b) separating the carrier 10 from release/mold layer 12. This can be done manually since, as previously discussed, release/mold layer 12 is not strongly adherent to plate 10. After removal of plate 10, release/mold layer 12 remains bonded to bumps 116, bumps 116', leads 16 and adhesive film 18, so it remains necessary to remove release/mold layer 12. This is done by (a) etching away all of nickel layer 12A and then (b) etching away all of copper layer 12B or by the use of a single etchant, such as ferric chloride, that will etch nickel and copper but not gold. That leaves the lower surface (gold plated surface 16A) of the leads 16 and the coplanar bumps 116 and 116' exposed. If a two step etch is used, it is accomplished by the use of two standard etches, the first being specific for nickel and the second being specific for copper. The removal of the support plate 10 and the etching of release/mold layer 12 is indicated at steps M and N in FIG. 20. It will be understood that the bumps 116' are coplanar with each other and with the bumps 116.

Figure 23:
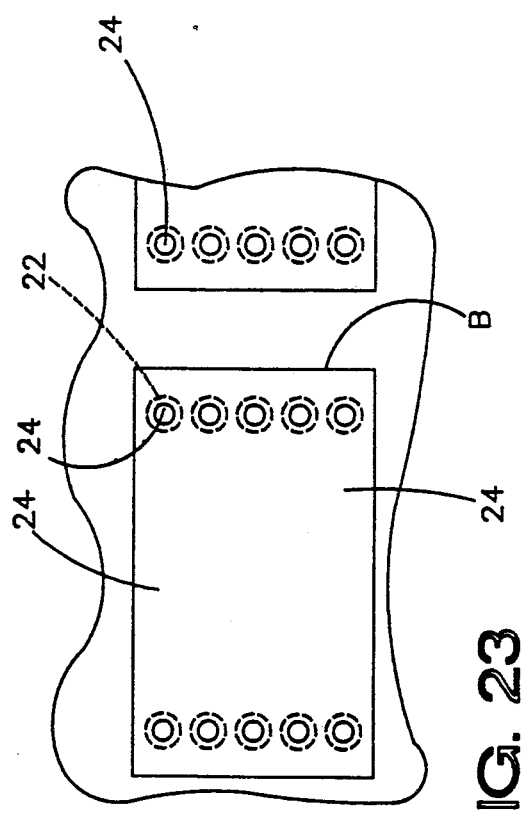
Figure 24:
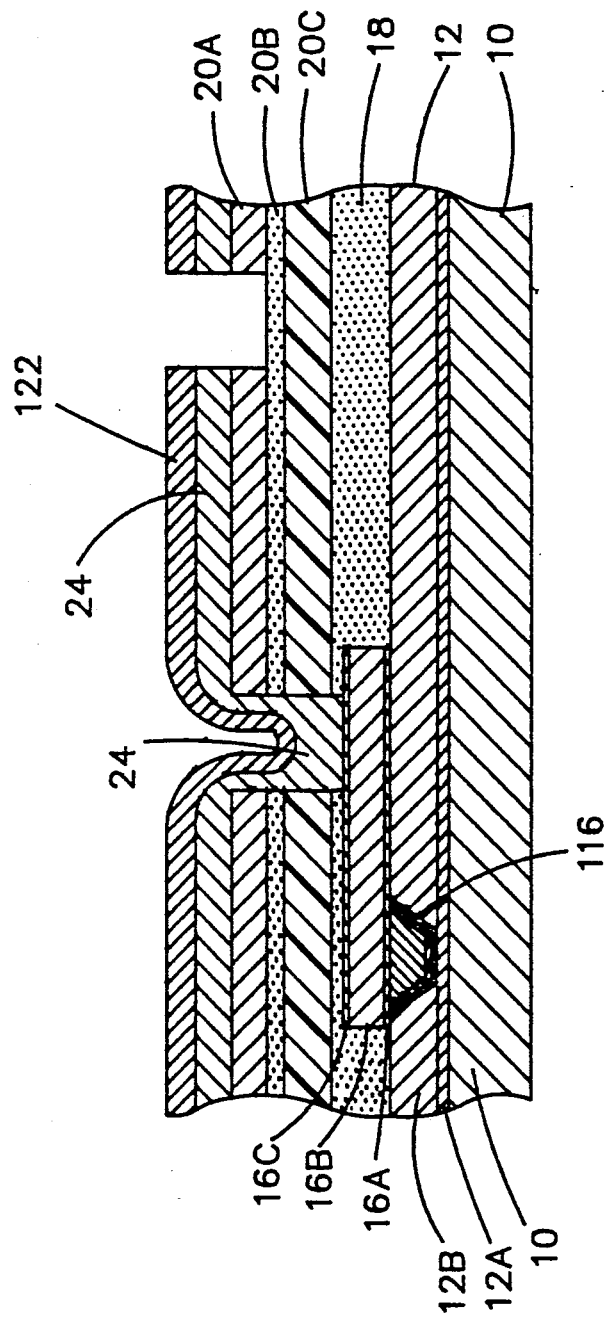

Upon the removal Of plate 10 and release/mold layer 12, the resulting structure consists of a multiplicity of the individual interconnect devices joined together in a single sheet-like structure by the adhesive 20B, dielectric 20C and adhesive 18 between the individual parts. The individual parts are then singulated, i.e., excised from the sheet-like structure, by any convenient means, such as die cutting, laser cutting, etc. in Step 0 of FIG. 25. The final parts would be as shown in FIGS. 14 and 23, but without carrier 10 and release layer 12.

Bearing in mind that copper layer 12(B) is formed by electroplating, and also bearing in mind that copper layer 12(B) must be as thick as the desired height of the contact bump in the final product, it will be appreciated that a long period of time is required to build up the layer 12(B) by electroplating if a high bump (e.g., 0.005" to 0.01" is desired). Those high bumps can be made, but it is time consuming with the electroplating process. As an alternative, the stainless steel backer 10 and the build-up of copper layer 12(B) by electroplating can be replaced by the use of a relatively thick (e.g., 0.005" to 0.010") sheet of copper on one surface of which a thin layer of nickel is coated, as by electrodeposition. This sheet of copper coated with nickel corresponds to layers 12(B) and 12(A), respectively. The process then proceeds from step C onwards to form either a single layer or multilayer circuit device. With this alternative use of a thick sheet of copper coated with nickel on one surface, the parallelism of the opposite surfaces of the thick copper sheet is relied upon to achieve precision coplanarity of the bump mesas 120.

As another modification, copper layer 12B could be replaced by a hard and rigid polymeric material such as a polyimide which could be solvent dissolved or laser etched away in step N. If this polyimide is used, it would be coated with a resist which would be exposed and developed to define the bump sites and the sites of the bumps would be dissolved out by a suitable solvent. The surface of the polyimide and the bump holes would then (after removal of the resist) be coated with a thin layer of metal (as by electroless deposition, sputtering, etc. so that it could serve as a base for further process electroplating steps). The manufacturing process would then continue from Step D.

Preferably, one or more tabs 130 with a through hole 132 is formed on each interconnect device (see FIGS. 1 and 14) to serve as a registration feature for aligning the bumps 116 and 116' to connect with whatever device (e.g., MCM) or circuit it is to be connected, which would also be provided with some registration feature to enable proper alignment to be realized.

By way of example, interconnect devices formed with the bumps of the present invention are particularly suitable for interfacing in pressure connections for MCM interconnections, printed circuit board interconnections, integrated circuit test probe circuits or chip to chip interconnects, and TAB test circuits. The invention may also be useful for interconnects other than pressure connectors, such as to connect TAB where the bumps would be on the inner lead portions of the TAB for direct bonding to the IC die.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A method for forming an electrical interconnect device having contact bumps, including the steps of:
    establishing a mold in which a plurality of flat topped contact bumps are to be formed, said mold including a relatively thin and flat layer of first material and a relatively thick layer of a second material, said second layer being selectively removable;
    defining sites in said second material at which the contact bumps are to be formed;
    selectively removing said second material at each of said sites to expose a flat area of said first material at each site to form a hole of predetermined size and shape in said second material intersecting said first material at said flat area;
    forming an electrically conductive contact element in each of said holes conforming to the shape of said hole; each of said electrically conductive contact elements having a flat surface coplanar with the flat surface of each of the other of said conductive elements;
    forming a plurality of electrical circuit lines on said second material, each of said circuit lines including at least one of said contact elements;
    bonding said circuit lines together with electrically insulating material; and
    removing said contact elements from said mold to define an interconnect device having a plurality of circuit lines with at least one contact bump in each circuit line, the contact bumps all being coplanar.

2. The method as in claim 1 wherein:
    said second material of said mold is copper;
    said first material of said mold is a metal other than copper; and
    each of said contact bumps is formed of at least a third material other than copper or said first material, said third material being placed in contact with said first and second materials in said molds, and copper which is placed in contact with said third material.

3. The method as in claim 2 wherein the step of forming said circuit lines includes:
    additively forming each circuit line on said second material of said mold by depositing a first layer of metal other than copper and a second layer of copper to define each circuit line.

4. The method as in claim 2 wherein:
    the hardness of said contact bumps is determined by the identity and amount of said third material and copper used in forming the contact bumps.

5. A method for forming an electrical interconnect device having contact bumps, including the steps of:

establishing a mold in which a plurality of flat topped contact bumps are to be formed, said mold including a relatively thin and flat layer of first material and a relatively thick layer of a second material, said second layer being selectively removable;

defining sites in said second material at which the contact bumps are to be formed;

selectively removing said second material at each of said sites to expose a flat area of said first material at each site to form a hole of predetermined size and shape in said second material intersecting said first material at said flat area;

forming an electrically conductive contact element in each of said holes conforming to the shape of said hole; each of said electrically conductive contact elements having a flat surface coplanar with the flat surface of each of the other of said conductive elements;

forming a plurality of electrical circuit lines on said second material, each of said circuit lines including at least one of said contact elements;

bonding to said circuit lines a laminate of a layer of dielectric material and a layer of conductive material, said dielectric material being bonded to said circuit lines and separating said circuit lines from said layer of conductive material;

forming at least one via hole through said laminate to at least one of said circuit lines;

forming a via connection from said layer of conductive material to said at least one circuit line through said via hole; and removing said contact elements from said mold to define an interconnect device having a plurality of circuit lines with at least one contact bump in each circuit line, the contact bumps all being coplanar, and a conductive layer connected by said at least one via to said at least one circuit line, said conductive layer constituting a voltage plane.

6. The method as in claim 5 wherein:
said second material of said mold is copper;
said first material of said mold is a metal other than copper; and
each of said contact bumps is formed of at least a third material other than copper or said first material, said third material being placed in contact with said first and second materials in said molds, and copper which is placed in contact with said third material.

7. The method as in claim 5 wherein the step of forming said circuit lines includes:
additively forming each circuit line on said second material of said mold by depositing a first layer of metal other than copper and a second layer of copper to define each circuit line.

8. The method as in claim 5 wherein:
the hardness of said contact bumps is determined by the identity and amount of said third material and copper used in forming the contact bumps.

* * * * *

UNITED STATES PATENT AND TRADEMARK OFFICE
CERTIFICATE OF CORRECTION

PATENT NO. : 5,072,520
DATED : December 17, 1991
INVENTORS : Gregory H. Nelson

It is certified that error appears in the above-identified patent and that said Letters Patent is hereby corrected as shown below:

In the Abstract, delete the last word, "means", and insert therefore, --mesas--.

Col. 2, line 24: Delete "FIG.S" and insert therefore --FIGS--.

Col. 2, line 40: The break in the line between "taken" and "along" should be eliminated.

Col. 3, line 3: After "surface", insert --.--.

Col. 3, line 42: Delete "prior" and insert therefore --Prior--.

Col. 5, line 45: After "0.002", delete "-" and insert therefore --"--.

Col. 7, line 60: Delete "FIGS. 1614 19" and insert therefore -- FIGS. 16-19--

Col. 8, line 15: Delete "pad 16" and insert therefore --pad 16'--.

Col 9, line 17: Delete "Of" and insert therefore --of--.

Signed and Sealed this

Twenty-eighth Day of September, 1993

*Attest:*

BRUCE LEHMAN

*Attesting Officer*  Commissioner of Patents and Trademarks